United States Patent
Arango et al.

(10) Patent No.: US 12,513,960 B2
(45) Date of Patent: Dec. 30, 2025

(54) METHOD FOR THE PRODUCTION OF IMPROVED SiC-SUBSTRATES AND SiC-EPILAYERS

(71) Applicant: Hitachi Energy Ltd, Zürich (CH)

(72) Inventors: Yulieth Cristina Arango, Zürich (CH); Giovanni Alfieri, Möriken (CH); Gianpaolo Romano, Baden (CH)

(73) Assignee: HITACHI ENERGY LTD, Zurich (CH)

( * ) Notice: Subject to any disclaimer, the term of this patent is extended or adjusted under 35 U.S.C. 154(b) by 0 days.

(21) Appl. No.: 18/896,610

(22) Filed: Sep. 25, 2024

(65) Prior Publication Data
US 2025/0113571 A1    Apr. 3, 2025

(30) Foreign Application Priority Data
Sep. 28, 2023   (EP) ...................................  23200325

(51) Int. Cl.
*H10D 62/832*   (2025.01)
*H01L 21/02*    (2006.01)

(52) U.S. Cl.
CPC .... *H10D 62/8325* (2025.01); *H01L 21/02378* (2013.01); *H01L 21/02447* (2013.01); *H01L 21/02529* (2013.01)

(58) Field of Classification Search
CPC ......... H01L 21/02378; H01L 21/02447; H01L 21/0415; H01L 21/046; H01L 21/265;
(Continued)

(56) References Cited

U.S. PATENT DOCUMENTS

| 9,508,802 | B2 | 11/2016 | Danno et al. | |
| 2015/0064882 | A1* | 3/2015 | Danno | H10D 8/60 |
| | | | | 438/478 |

(Continued)

FOREIGN PATENT DOCUMENTS

| EP | 4089719 A1 | 11/2022 |
| EP | 4095888 A1 | 11/2022 |

(Continued)

OTHER PUBLICATIONS

Saks, Low-dose nitrogen implants in 6H-silicon carbide, 2000, Applied Physics Letters, vol. 76, No. 14, 1896-1897 (Year: 2000).*

(Continued)

*Primary Examiner* — Ajay Ojha
*Assistant Examiner* — Sandra Milena Rodriguez Villanu
(74) *Attorney, Agent, or Firm* — PROCOPIO, CORY, HARGREAVES & SAVITCH LLP

(57) ABSTRACT

The invention relates to a method for manufacturing a Silicon Carbide (SiC) substrate, at least comprising the steps of:
a) providing the SiC-substrate, wherein the SiC-substrate is suitable for growing a SiC-epilayer thereon; and
b) implanting group Va elements in the SiC-substrate by irradiating at least a part of the SiC-substrate with group Va ions, wherein the irradiation is performed at an energy of greater than or equal to 100 keV and less than or equal to 200 keV and an irradiation dose of greater than or equal to $10^5$ cm$^{-2}$ and less than or equal to $10^{10}$ cm$^{-2}$. Furthermore, the invention relates to a method for manufacturing a Silicon Carbide epilayer, a SiC substrate and a semiconductor device.

10 Claims, 2 Drawing Sheets

(58) Field of Classification Search
CPC ............ H01L 21/425; H01L 21/76859; H10D 62/8325; C01B 32/956
See application file for complete search history.

(56) References Cited

U.S. PATENT DOCUMENTS

| | | | |
|---|---|---|---|
| 2015/0263086 | A1 | 9/2015 | Mizukami et al. |
| 2021/0225645 | A1* | 7/2021 | Gendron-Hansen ........................ H01L 21/0465 |

FOREIGN PATENT DOCUMENTS

| | | |
|---|---|---|
| JP | 2009111007 A | 5/2009 |
| JP | 2012243812 A | 12/2012 |
| JP | 2015176995 A | 10/2015 |
| JP | 2020113619 A | 7/2020 |
| JP | 2022048926 A | 3/2022 |
| JP | 2024060938 A | 5/2024 |

OTHER PUBLICATIONS

Eddin & Pizzagalli, "First principles calculation of noble gas atoms properties in 3C—SiC", Journal of Nuclear Materials, Elsevier, 2012, 429 (1-3), pp. 329. 10.1016/j.jnucmat.2012.06.022. hal-00728924, 9 pages.

Heidorn et al., "Basal Plane Dislocation Conversion Enhancement in 4H—SiC Homo-Epitaxial Layers by Ion Implantation into the Wafer", Materials Science Forum, ISSN: 1662-9752, vol. 963, pp. 114-118, doi:10.4028/www.scientific.net/MSF.963.114, Jul. 19, 2019, 5 pages.

Hemmingsson et al., "Deep level defects in electron-irradiated 4H SiC epitaxial layers", J. Appl. Phys. 81 (9), May 1, 1997, 5 pages.

Kalinina et al., "Gettering Effect with Al Implanted into 4H—SiC CVD Epitaxial Layers", Materials Science Forum vols. 433-436 (2003) pp. 637-640, (2003) Trans Tech Publications, Switzerland, doi:10.4028/www.scientific.net/MSF.433-436.637, 5 pages.

Danno et al., "Diffusion of Transition Metals in 4H—SiC and Trials of Impurity Gettering", Applied Physics Express 5 (2012) 031301, DOI: 10.1143/APEX.5.031301, downloaded on May 17, 2017, 4 pages.

Danno et al., "Diffusion and gettering of transition metals in 4H—SiC", Materials Science Forum vols. 717-720 (2012) pp. 225-228, (2012) Trans Tech Publications, Switzerland, 5 pages.

Bathen et al,, "Anisotropic and plane-selective migration of the carbon vacancy in SiC: Theory and experiment", Jul. 8, 2019, Phys. Rev. B 100, 014103, 15 pages.

Achtziger et al., "Band gap states of Ti, V, and Cr in 4H-silicon carbide", Applied Physics Letters 71, 110 (1997); doi: 10.1063/1.119485, 4 pages.

Ivady et al., "Asymmetric Split-Vacancy Defects in SiC Polytypes: A Combined Theoretical and Electron Spin Resonance Study", PRL 107, 195501 (2011), week ending Nov. 4, 2011, 6 pages.

Extended European Search Report issued in related european patent application No. EP 23200325.1, dates Mar. 5, 2024, 6 pages.

Hiroyuki Matsunami, "Technology of Semiconductor SiC and Its Application", 2003, Nikkan Kogyo Shimbun, Ltd., ISBN-4-526-05096-2, 8 pages, Cited in Decision for Rejection issued in corresponding Japanese Patent Application JP2024-090643 mailed Apr. 8, 2025.

Decision for Rejection issued in corresponding Japanese Patent Application JP2024-090643, mailed Apr. 8, 2025, 5 pages.

* cited by examiner

METHOD FOR THE PRODUCTION OF IMPROVED SiC-SUBSTRATES AND SiC-EPILAYERS

CROSS REFERENCE TO RELATED APPLICATIONS

This application claims priority to European Patent Application No. 23200325.1, filed Sep. 28, 2023, the contents of which are incorporated herein by reference in its entirety for all purposes.

TECHNICAL FIELD

The invention relates to a method for manufacturing Silicon Carbide (SiC) substrates and SiC epilayers on top of such substrates, wherein the substrates are modified to trap Transition Metals (TM). In addition, the invention further relates to modified SiC-substrates as such and to semiconductor devices comprising said SiC-substrates.

BACKGROUND ART

For the functionality and the lifetime of state-of-the-art electronics the quality of semiconductor devices is of utmost importance. Especially in the field of epitaxially grown SiC layers impurities have to be avoided, because such impurities can impair the structure and the electronic properties of the semiconductor layers. Such defects are especially detrimental in semiconductors layers processed for high voltage (HV) applications. One source of unwanted impurities introduced in the process and the layers are TMs. TMs are usually present in the crucible material and can be incorporated in the SiC boule or the SiC substrate during bulk growth. After preparation of the substrate, during homoepitaxy of the epilayer, such impurities can diffuse into the final epilayer. It is known that transition metal impurities form deep levels in the band gap of SiC that can harm the functionality of the device. As a function of the crucible material and the overall processing conditions the TM concentration in the epilayer can be in the range from $10^{13}$ cm$^{-3}$ up to $10^{14}$ cm$^{-3}$. Such TM presence in the epilayer causes a serios problem for the manufacture of HV devices, because in HV applications the epilayers are only lightly doped (<$10^{14}$ cm$^{-3}$). For this reason, it is important to reduce the TM concentration in the epilayer or to passivate the TMs beforehand.

Also, the patent literature discloses suitable means for the handling of impurities in SiC semiconductor devices. U.S. Pat. No. 9,508,802 B2 for instance discloses a process for producing a semiconductor device. The process includes forming a SiC epitaxial layer on a SiC substrate; implanting the epitaxial layer with ions; forming a gettering layer having a higher defect density than a defect density of the SiC substrate; and carrying out a heat treatment on the epitaxial layer. The semiconductor device includes a SiC substrate, a SiC epitaxial layer formed on the SiC substrate, and a gettering layer having a higher defect density than a defect density of the SiC substrate. This method is based on implanting He in the epilayer. After high temperature treatments, the He implanted region will act as a gettering layer for the diffusing TM. The drawback of this method is, that the implantation of the epilayer creates more electrically active defects which, in turn, will have an impact on the electronic properties of the finished HV device in terms of leakage current, minority carrier's lifetime and on-resistance.

SUMMARY OF INVENTION

It is therefore an object of the invention to provide solutions for improving the quality and the performance of SiC-epilayers, in particular by reducing the TM concentration incorporated in the SiC epilayers upon processing. Particularly it is an object of the present invention to avoid or reduce disadvantages of known solutions.

The object of the invention is solved by the features of the independent claims. Preferred embodiments are detailed in the dependent claims.

Thus, the object is solved by a method for manufacturing a Silicon Carbide (SiC) substrate, at least comprising the steps of:

a) providing the SiC-substrate, wherein the SiC-substrate is suitable for growing a SiC-epilayer thereon; and b) implanting group Va elements in the SiC-substrate by irradiating at least a part of the SiC-substrate with group Va ions, wherein the irradiation is performed at an energy of greater than or equal to 100 keV and less than or equal to 200 keV and an irradiation dose of greater than or equal to $10^5$ cm$^{-2}$ and less than or equal to $10^{10}$ cm$^{-2}$.

In other words, particularly, the present invention suggests a method for manufacturing a Silicon Carbide (SiC) substrate. SiC substrates are generally used as a basis for growing structurally defined SiC-epilayers thereon. The material and the structures are used as semiconductors in high voltage and/or high temperature applications. The substrate may be present in the form of a boule or a wafer. In case that a boule is used, wafers can be cut from the boules in a later step in order to produce wafers. In case that the substrate is in the form of a wafer, the wafer dimensions can be tailored according to the special needs. Standard wafer thicknesses and diameters can be used in the inventive process. The substrate thickness may for instance be in the range of 10-400 μm. Suitable substrate diameters can be in the range from 1 cm to 10 cm. Typical boule dimensions are in the range from 10 to 20 cm.

The method comprises step a). In this step a SiC-substrate is provided, wherein the SiC-substrate is suitable for growing a SiC-epilayer thereon. This means, that the substrates are suitable for providing the necessary features to deposit at a later step structurally coherent and defined SiC-epilayers thereon. Defined SiC-epilayers may e.g. be 2H-, 4H-, or 6H—SiC epilayers. 4H- and 6H—SiC epilayers are preferred. The substrate can for instance be a seeded substrate, wherein a special seed layer is included on top of the substrate. The seed layer can also be deposited after forming the inventive substrate. The substrates are especially suitable for growing in case that a suitable epilayer can be formed thereon by using a high temperature chemical vapor deposition technique or any other technique achieving a structurally well-defined epilayer.

In addition, the method comprises the step b) of implanting group Va elements in the SiC-substrate by irradiating at least a part of the SiC-substrate with group Va ions. The SiC substrate is modified by incorporation of group Va elements into the substrate. Group Va elements are element from the 5$^{th}$ main group of the periodic system of elements, i.e. N, P, As, Sb, Bi. Preferred are the elements N, P and As. The implantation or incorporation can for instance be performed by acceleration of the elements in a particle form and bombarding the substrate with the accelerated particles. The elements can for instance be kinetically incorporated into the substrate by the irradiation. A suitable implanting of the group Va elements may be based on incorporation of the respective ions, wherein the Va ions are accelerated by an electrical accelerator and directed to a substrate surface.

The irradiation in step b) is performed at an energy of greater than or equal to 100 keV and less than or equal to 200 keV and an irradiation dose of greater than or equal to $10^5$ $cm^{-2}$ and less than or equal to $10^{10}$ $cm^{-2}$. The overall irradiation conditions in the form of the energy and the dose are selected in order to achieve a certain Va implantation level in the substrate. The selection of the irradiation parameters especially enables the generation of carbon vacancies (VC) in the substrate without altering the electrical properties of the substrate. Therefore, it is not the intention of the irradiation or implantation process to specifically affect the resistivity or conductivity of the substrate. Such alterations are not achieved in the specified dose and energy level. Higher doses and/or higher energy levels might result in an unwanted alteration of the electrical substrate properties, wherein especially the resistivity of the substrate might be affected.

By means of the invention and by means of aspects described in the present application an improved SiC substrate is provided, wherein the substrate is able to trap TM metals on VC sites by forming Transition Metal VC (TM-VC) complexes. It is known that transition metals act as acceptors especially in n-type 4H—SiC. For this reason, it is proposed to use carbon vacancies, which are able to effectively bind to transition metals. VC-TM complexes are formed easily and are energetically stable. By this method the TM gettering/passivation layer is formed in or by the substrate, prior to epilayer growth. In this way, the final device will not be affected by further ion beam treatments. Implantation will lead to the formation of VC, but the resistivity of the substrate will not be affected due to the presence of the implanted group Va elements. The proposed implantation characteristics are suitable to achieve a suitable VC concentration in the substrate. The VC concentration achievable by these ranges will not affect the resistivity of the substrate. In addition, the dose is below the amorphization level of the crystal, so no high temperature post-implantation treatment is necessary.

The TM gettering is performed in the substrate, without harming the crystalline structure of a deposited epilayer. This leaves the epilayer structurally intact and results in better physical characteristics. The TM-VC complexes are energetically very stable, effectively hindering TM out diffusion from the substrate to the epilayer during homoepitaxial growth.

Such solution is preferable compared to the use of extra buffer layers because buffer layers have to be grown in a separate step, whereas the trapping proposed in this invention is performed by implantation. In contrast to buffer layers, which are highly doped, the doping of this implanted layer is much lower, resulting in unchanged electric properties of the substrate. The high doping of buffer layers also results in a faster TM diffusion, because the Fermi level of buffer layers is close to the conduction band. This means that the formation energy of TM in such buffer layer would decrease also affecting the migration and the diffusion energy.

In consequence, the proposed solution comprises several benefits compared to buffer layers known in the art.

The object is further solved by a method for manufacturing a Silicon Carbide (SiC) epilayer on a SiC substrate, at least comprising the steps of:

a) providing the SiC-substrate, wherein the SiC-substrate is suitable for growing a SiC-epilayer thereon;

b) implanting group Va elements in the SiC-substrate by irradiating at least a part of the SiC-substrate with group Va ions, wherein the irradiation is performed at an energy of greater than or equal to 100 keV and less than or equal to 200 keV and an irradiation dose of greater than or equal to $10^5$ $cm^{-2}$ and less than or equal to $10^{10}$ $cm^{-2}$; and c) epitaxially growing a SiC-epilayer on top of the SiC-substrate obtained in method step b), wherein the growing is performed at a temperature of greater than or equal to 1200° C. and less than or equal to 1500° C.

This method can be considered to be the method for producing the final product, wherein the method previously described can be considered to be the method for producing the intermediate product. The difference can be seen in the last method step c), wherein the epitaxial layer is produced.

Surprisingly, it has been found that in case that the epitaxial layer is grown under above defined conditions the out-diffusion of TMs from the substrate is very low, resulting in improved epitaxial layers. Especially, the structure and the electrical properties of the epitaxial layer are superior to the standard, resulting in SiC epitaxial layers comprising a long live span. For the further benefits of the method for producing the SiC epitaxial layers it is especially referred to the method for producing the SiC substrate. Higher temperatures in method step b) can be disadvantageous, because in this case TMs might diffuse into the epilayer. Lower temperatures can be disadvantageous, because the growing of the epilayer is hindered.

The object is further solved by a SiC-substrate, wherein the SiC-substrate comprises Carbon vacancies (VC) and transition metal VC complexes, wherein the sum of the VC and the transition metal VC complex concentration is greater than or equal to $10^{12}$ $cm^{-3}$ and less than or equal to $10^{16}$ $cm^{-3}$. The sum of the VC and the TM-VC complexes in the substrate can be assessed by electron spin resonance (ESR) experiments. Both species have a definite and unique ESR signature, and the measurement can be performed quantitatively. The VC and the transition metal VC complex concentration can be assessed separately and both concentrations are added to result in the sum. The substrate can be present in the form of a boule of regular or irregular shape or the substrate can be present in the form of a flat disc, plate or wafer. Plate-shape means that a shape is flat and/or at least substantially extends towards two of three dimensions. A plate may be flat in one direction but substantially elongated in two directions, while all three directions are perpendicular to each other. Particularly, each of a width and a length of a plate is at least by a factor of 2, 5, 10, 50, 100 or more larger than a thickness in order to be considered having a plate-shape. The advantage of the SiC-substrate according to the invention are discussed above in the context of the method for manufacturing the inventive SiC-substrate.

In addition, the object is further solved by a semiconductor device comprising a SiC-substrate and an epitaxial layer thereon, wherein the SiC-substrate is a SiC-substrate according to the invention. Especially, semiconductor devices may benefit from the improved SiC substrate. The devices may comprise better electronic characteristics and may show a better lifespan. Such benefits are achieved by controlling and reducing the TM content in the epilayers of the devices. Semiconductor devices may for instance be thyristors, diodes, gate turn-off thyristors, power metal-insulating-semiconductor field-effect transistors, power metal-oxide-semiconductor field-effect transistors, junction field-effect transistor, bipolar junction transistors, insulated-gate bipolar transistors or integrated gate-commutated thyristors. The advantage of the semiconductor devices according to the invention are discussed above in the context of the method for manufacturing the inventive SiC-substrate and the SiC-substrate.

In a first preferred implementation of the method for manufacturing a SiC substrate, in an additional method step b') the SiC-substrate obtained in method step b) is heat treated at temperature of greater than or equal to 1000° C. and less than or equal to 1700° C. for a time-period of greater than or equal to 5 h and less than or equal to 24 h. A heat treatment of the substrate under the above-mentioned conditions is able to equilibrate the substrate and accelerates TM-VC complex formation in cases, wherein in the substrate TMs are already present. This step might reduce the number of diffusible TMs in the substrate. Preferably, this annealing step can be performed at temperature of greater than or equal to 1100° C. and less than or equal to 1600° C. for a time-period of greater than or equal to 8 h and less than or equal to 20 h, further, this annealing step can be performed at temperature of greater than or equal to 1200° C. and less than or equal to 1400° C. for a time-period of greater than or equal to 10 h and less than or equal to 18 h. By this annealing preferably a homogeneous Va ion and VC distribution is generated throughout the substrate. The distributions are homogeneous throughout the substrate in cases, wherein the concentrations differ less than 10 mol %/cm$^3$. Concentrations can be quantitatively determined as a function of the location within the substrate by EPR.

In a second preferred implementation of the method for manufacturing a SiC substrate, in step b) carbon vacancies (VC) are generated in the substrate, wherein the VC concentration in the substrate is greater than or equal to $10^{13}$ cm$^{-3}$ and less than or equal to $10^{17}$ cm$^{-3}$. This VC concentration has been found useful to trap sufficient TMs in the substrate and to avoid the possible TM diffusion to epilayers during the epitaxial growth to a large extent. Lower concentrations can be disadvantageous because an insufficient complex formation with the TMs is achieved. Higher concentrations can be disadvantageous, because the electrical characteristics of the substrate are affected in a significant way. Furthermore, the VC concentration in the substrate can be greater than or equal to $10^{14}$ cm$^{-3}$ and less than or equal to $10^{16}$ cm$^{-3}$.

In a third preferred implementation of the method for manufacturing a SiC substrate, the group Va ions are selected from a group consisting of nitrogen-ions, phosphor-ions or mixtures thereof. The implantation of N- and P-ions into the substrate has been found useful to reliably generate the necessary VC concentration in a variety of substrates without changing the electronic properties of the substrate.

In a fourth preferred implementation of the method for manufacturing a SiC substrate, the resistivity of the SiC-substrate after step b) is altered to less than 10% compared to the resistivity of the SiC-substrate in step a). One of the major advantages of method a hand is, that the resistivity of the substrate is essentially unchanged due to the implantation of group Va ions and by generating the VCs. In a preferred embodiment the resistivity of the SiC-substrate after step b) is altered to less than 8% compared to the resistivity of the SiC-substrate in step a) and, further preferred, the resistivity of the SiC-substrate after step b) is altered to less than 5% compared to the resistivity of the SiC-substrate in step a). The resistivity of the substrate is assessed at 20° C. according to methods known to the skilled artisan, like for instance the four-point probe method with removable graphite contacts.

In a fifth preferred implementation of the method for manufacturing a SiC substrate, the implantation density of the group Va ions in the SiC-substrate is greater than or equal to $10^{10}$ cm$^{-3}$ and less than or equal to $10^{16}$ cm$^{-3}$. The implantation of such group Va ions into the SiC substrate has been found useful to generate an optimal VC concentration in the substrate. The overall electric and structural characteristics of the substrate remain mainly unaltered. Furthermore, the density of the group Va ions in the SiC-substrate is greater than or equal to $10^{11}$ cm$^{-3}$ and less than or equal to $10^{15}$ cm$^{-3}$ and, further preferred, the density of the group Va ions in the SiC-substrate can be greater than or equal to $10^{12}$ cm$^{-3}$ and less than or equal to $10^{14}$ cm$^{-3}$. It is further preferred that implantation is homogeneous throughout the substrate.

In a sixth preferred implementation of the method for manufacturing a SiC substrate, the SiC-substrate in method step a) and method step b) comprises n-type conductivity. Especially, for substrates comprising n-type conductivity the method according to the invention can result in a very effective VC generation and TM complexation. Furthermore, the formed TM-VC complexes are very stable and epitaxial layers can be grown on the TM free substrate.

In a seventh preferred implementation of the method for manufacturing a SiC substrate, step b) is performed at a temperature of greater than or equal to 20° C. and less than or equal to 800° C. This temperature range in the Va implantation and VC generating step can result in a reasonable homogeneous VC distribution in the substrate.

In a first preferred implementation of the method for manufacturing a SiC epilayer, after the method step b) and prior to the method step c) the SiC-substrate is heat treated at temperatures of greater than or equal to 1000° C. and less than or equal to 1900° C. for a time-period of greater than or equal to 0.5 h and less than or equal to 24 h. For a safe and reproducible TM complexation in the substrate prior to epitaxial growth it has been found useful, to anneal the substrate under above given conditions. The structure of the substrate is not altered, but, presumably based on diffusion processes, the TMs are captured. Non-diffusible complexes are generated. These complexes are fairly stable and the complexes do not interact with the epilayer grown in step c). In consequence, TM free or TM reduced epilayers are achieved, showing better electronic properties and longer lifespans.

In a second preferred implementation of the method for manufacturing a SiC epilayer, the thickness of the SiC-epilayer is greater than or equal to 50 µm and less than or equal to 250 µm. The method of the manufacturing a SiC epilayer is especially suited for generating epilayers in above depicted thickness. The epilayers are especially suited for high voltage applications and based on the fact that TMs are securely trapped in the substrate the epilayers show a remarkable lifespan and homogeneous electric properties. In addition, the thickness of the SiC-epilayer can be greater than or equal to 60 µm and less than or equal to 200 µm and, further preferred, the thickness of the SiC-epilayer can be greater than or equal to 80 µm and less than or equal to 50 µm.

In a first preferred implementation of the semiconductor device, the epitaxial layer is a n-type 4H—SiC epitaxial layer. Especially, 4H SiC epitaxial layers of the n-type can benefit from the reduced TM concentration in the epitaxial layers.

In a second preferred implementation of the semiconductor device, the thickness of the epitaxial layer is greater than or equal to 50 µm and less than or equal to 200 µm. The advantages of semiconductor devices comprising such thickness range of the epitaxial layer were already discussed in the context of the epilayer.

BRIEF DESCRIPTION OF DRAWINGS

These and other aspects of the invention will be apparent from and elucidated with reference to the implementations described hereinafter.

In the drawings.

DESCRIPTION OF IMPLEMENTATIONS

The description contains procedural or methodical aspects upon describing structural features of the claimed invention; the structural features can be understood well in that way. It is emphasized to the reader that such structural features can be lifted from the described context without hesitation or the question of an intermediate generalization to form aspects of the invention. It is also emphasized to the reader that any the structural features described in the following can be understood as individual aspects of the invention to distinguish from known solutions, despite being possibly lifted from the context.

Figure 1:
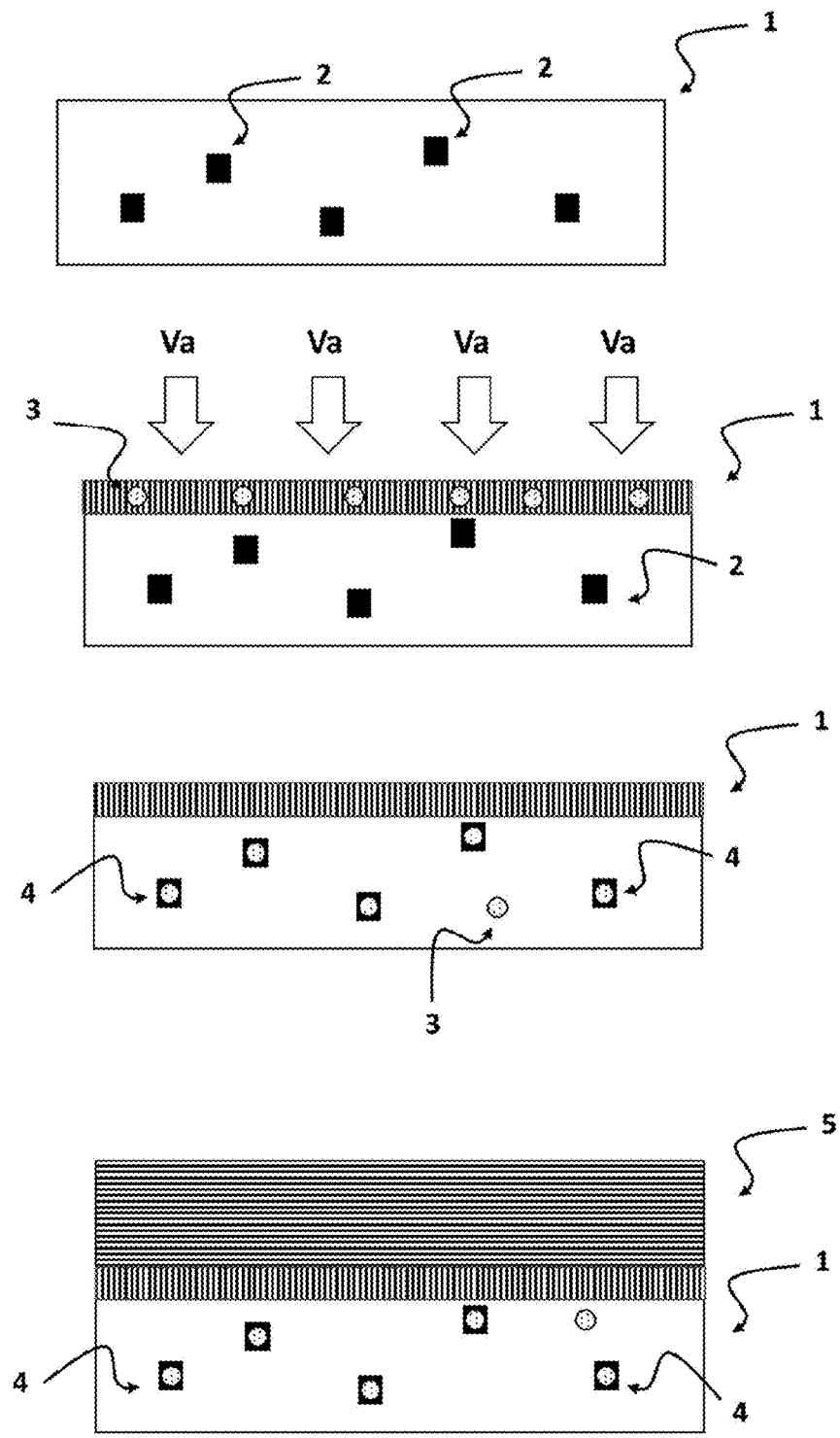
FIG. 1 shows a preferred embodiment of the method according to the invention for manufacturing a Silicon Carbide (SiC) substrate.

In FIG. 1 a process for the manufacturing of a SiC substrate 1 is shown. The provided substrate 1 can be in the form of a boule, wafer or a plate. In this figure a plate-like geometry is depicted. The SiC substrate 1 comprises transition metals 2. The TMs 2 are distributed within the SiC substrate 1. In a next process step, method step b), the SiC substrate 1 is irradiated with group Va elements. The group Va elements can be in the form of particles or ions. Preferably, the group Va elements are provided in the form of ions and the ions are accelerated and kinetically implanted in the SiC substrate 1. The implantation of the Va ions in the SiC substrate 1 results in the formation of carbon vacancies VC 3. The SiC substrate 1 can be annealed in a separate method step at higher temperatures. The annealing results in the diffusion of the VCs 3 and the TMs 2 and positionally stable TM-VC complexes 4 are formed. The TM-VC complexes 4 remain trapped at the formation site and are not able to diffuse throughout the SiC substrate 1 anymore. By using this method steps a SiC substrate 1 is generated comprising less mobile TMs 2. The SiC substrate 1 can be stored for further processing. In addition, it is possible to immediately use the SiC substrate 1 for epitaxially growing an epitaxial layer 5 onto the substrate 1. The epitaxial growth of the epitaxial layer 5 can be performed according to methods known to the skilled artisan. By including this separate method step a SiC epilayer 5 on a SiC substrate 1 is generated, wherein the SiC epilayer 5 is free of TMs 2. Generally, the overall concentration of diffusible TMs 2 is greatly decreased. By using this method, epilayers 5 for high voltage applications can be generated. The epilayers 5 can for instance be 4-H SiC epilayers.

Figure 2:
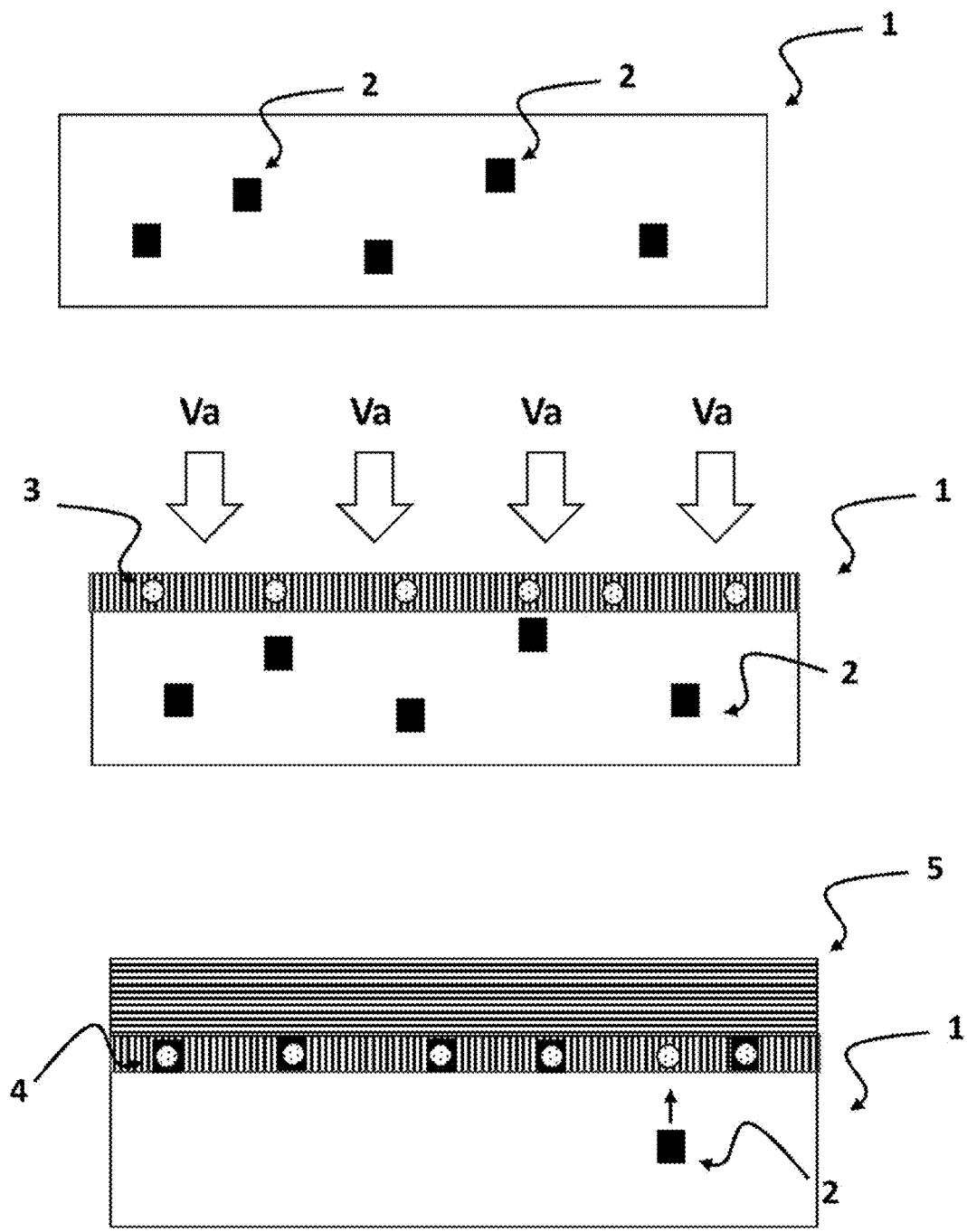
FIG. 2 shows a preferred embodiment of the method according to the invention for manufacturing a Silicon Carbide epilayer on a SiC substrate.

In FIG. 2 a process for the manufacturing of a SiC epilayer 5 on a SiC substrate 1 is shown. The provided substrate 1 can be in the form of a boule or a wafer or plate. In this figure a plate-like geometry is used. The SiC substrate 1 comprises transition metals 2. The TMs 2 are distributed within the SiC substrate 1. In a next process step, method step b), the SiC substrate 1 is irradiated with group Va elements. The group Va elements can be in the form of particles or ions. Preferably, the group Va elements are provided in the form of ions and the ions are accelerated and kinetically implanted in the SiC substrate 1. The implantation of the Va ions in the SiC substrate 1 results in the formation of carbon vacancies 3. Such SiC substrate 1 can be used in a next method step, wherein an epilayer 5 is grown onto the surface of the SiC substrate 1. In the course of epilayer 5 growth the TMs 2 diffuse through the SiC substrate 1 and are trapped at the VC 3. In this figure it is depicted, that there is still one diffusible TM 2 not bound by a VC 3. The rest of the TMs 2 is transformed to thermodynamically and positionally stable TM-VC complexes 4. The TM-VC complexes 4 remain in the SiC substrate 1 and do not diffuse into the epilayer 5 during epitaxial growth. This can reduce the TM 2 load of the epilayer 5 and improve the electronic and structural characteristics of the epilayer 5. The epitaxial growth of the epitaxial layer 5 can be performed according to methods known to the skilled artisan. By using this method, epilayers 5 for high voltage applications can be generated. The epilayers 5 can for instance be 4-H SiC epilayers.

A possible method sequence might include the provision of a SiC substrate 1, wherein the SiC substrate 1 comprises a thickness of 350 μm. The SiC substrate 1 is N-doped in a concentration of $10^{18}$ cm$^{-3}$ and comprises approximately a TM concentration of ~$10^{14}$ cm$^{-3}$. The implantation of the Va group elements is performed in process step b). The implantation is performed at RT by implementation of N-ions. A dose of $10^7$ cm$^{-2}$ is used and the implantation energy is 100 keV. By using these parameters approximately $3\times10^{14}$ cm$^{-3}$ VC are generated, with an implanted N concentration of approx. $10^{12}$ cm$^{-3}$. An additional annealing step is carried out at 1200° C. for 10h. In this step the Vc-TM complexes 4 are formed. In a next step a 100 μm 4H—SiC epilayer 5 is grown (N~$10^{14}$ cm$^{-3}$). No TMs 2 are found in the epitaxially grown layer 5. In addition, the resistivity of the epitaxial layer 5 is unharmed. A device can now be formed. An anode is formed by Al implantation, followed by annealing 30 min at 1700° C. By RIE, a mesa is formed and Ohmic metals are deposited and a 10 kV pin diode is manufactured.

REFERENCE SIGNS LIST

1 SiC substrate
2 Transition Metal (TM)
3 Carbon vacancy (VC)
4 Transition Metal-Carbon Vacancy (TM-VC) complex
5 Epilayer

The invention claimed is:

1. A method for manufacturing a Silicon Carbide (SiC) substrate, the method comprising:
    a) providing the SiC-substrate, wherein the SiC-substrate is suitable for growing a SiC-epilayer thereon; and
    b) implanting group Va elements in the SiC-substrate by irradiating at least a part of the SiC-substrate with group Va ions, wherein the irradiation is performed at an energy of greater than or equal to 100 keV and less than or equal to 200 keV and an irradiation dose of greater than or equal to $10^5$ cm$^{-2}$ and less than or equal to $10^{10}$ cm$^{-2}$, wherein the resistivity of the SiC-substrate after step b) is altered to less than 10% compared to the resistivity of the SiC-substrate in step a).

2. The method according to claim 1, wherein in an additional method step b') the SiC-substrate obtained in method step b) is heat treated at temperature of greater than or equal to 1000° C. and less than or equal to 1700° C. for a time-period of greater than or equal to 5 h and less than or equal to 24 h.

3. The method according to claim 1, wherein in step b) carbon vacancies (VC) are generated in the substrate, the VC are able to trap transition metals by forming transition metal VC (TM-VC) complexes, and wherein the VC concentration in the substrate is greater than or equal to $10^{13}$ cm$^{-3}$ and less than or equal to $10^{17}$ cm$^{-3}$.

4. The method according to claim 1, wherein the group Va ions are selected from a group consisting of nitrogen-ions, phosphor-ions or mixtures thereof.

5. The method according to claim 1, wherein the implantation density of the group Va ions in the SiC-substrate is greater than or equal to $10^{10}$ cm$^{-3}$ and less than or equal to $10^{16}$ cm$^{-3}$.

6. The method according to claim 1, wherein the SiC-substrate in method step a) and method step b) comprises n-type conductivity.

7. The method according to claim 1, wherein step b) is performed at a temperature of greater than or equal to 20° C. and less than or equal to 800° C.

8. A method for manufacturing a Silicon Carbide (SiC) epilayer on a SiC substrate, the method comprising:

a) providing the SiC-substrate, wherein the SiC-substrate is suitable for growing a SiC-epilayer thereon;
b) implanting group Va elements in the SiC-substrate by irradiating at least a part of the SiC-substrate with group Va ions, wherein the irradiation is performed at an energy of greater than or equal to 100 keV and less than or equal to 200 keV and an irradiation dose of greater than or equal to $10^5$ cm$^{-2}$ and less than or equal to $10^{10}$ cm$^{-2}$, wherein the resistivity of the SiC-substrate after step b) is altered to less than 10% compared to the resistivity of the SiC-substrate in step a); and
c) epitaxially growing a SiC-epilayer on top of the SiC-substrate obtained in method step b), wherein the growing is performed at a temperature of greater than or equal to 1200° C. and less than or equal to 1500° C.

9. The method according to claim 8, wherein after the method step b) and prior to the method step e) the SiC-substrate is heat treated at temperature of greater than or equal to 1000° C. and less than or equal to 1900° C. for a time-period of greater than or equal to 0.5 h and less than or equal to 24 h.

10. The method according to claim 8, wherein the thickness of the SiC-epilayer is greater than or equal to 50 μm and less than or equal to 250 μm.

* * * * *